United States Patent
Tsacoyeanes et al.

(10) Patent No.: US 8,879,045 B2
(45) Date of Patent: Nov. 4, 2014

(54) METHOD UTILIZING AN ELECTROOPTIC MODULATOR

(75) Inventors: James G. Tsacoyeanes, Southbury, CT (US); Pradeep K. Govil, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 892 days.

(21) Appl. No.: 12/963,980

(22) Filed: Dec. 9, 2010

(65) Prior Publication Data

US 2011/0075236 A1 Mar. 31, 2011

Related U.S. Application Data

(62) Division of application No. 11/005,222, filed on Dec. 7, 2004, now Pat. No. 7,876,420.

(51) Int. Cl.
*G03F 7/20* (2006.01)
(52) U.S. Cl.
CPC ........ *G03F 7/70291* (2013.01); *G03F 7/70191* (2013.01); *G03F 7/70308* (2013.01)
USPC .......................................................... 355/71
(58) Field of Classification Search
CPC .......................... G03F 7/70191; G03F 7/70308
USPC ............ 355/63, 53, 55, 71, 46; 359/351, 321, 359/726
See application file for complete search history.

(56) References Cited

U.S. PATENT DOCUMENTS

| | | | |
|---|---|---|---|
| 3,443,857 A | 5/1969 | Warter, Jr. | |
| 3,532,891 A | 10/1970 | Simmons et al. | |
| 3,988,704 A | 10/1976 | Rice et al. | |
| 4,516,837 A | 5/1985 | Soref et al. | |
| 4,688,900 A | 8/1987 | Doane et al. | |
| 4,768,043 A | 8/1988 | Saito et al. | |
| 4,851,882 A | 7/1989 | Takahashi et al. | |
| 5,024,511 A | 6/1991 | Matsubara et al. | |

(Continued)

FOREIGN PATENT DOCUMENTS

| | | |
|---|---|---|
| EP | 1 139 521 A1 | 10/2001 |
| EP | 1 262 836 A1 | 12/2002 |

(Continued)

OTHER PUBLICATIONS

Lithium Triborate—LBO, EKSMA Co., 2 pages, undated.

(Continued)

*Primary Examiner* — Peter B Kim
(74) *Attorney, Agent, or Firm* — Sterne, Kessler, Goldstein & Fox P.L.L.C (57) ABSTRACT

A method utilizes a dynamically controllable optical element that receives an electrical field, which changes an index of refraction in at least one direction within the optical element. The change in index of refraction imparts a change to a beam of radiation passing through the optical element. The electric field is controlled by a feedback/control signal from a feedback system that includes a detector positioned proximate an image plane in the system. The optical element can be positioned in various places within the system depending on what light characteristics need to be adjusted, for example after an illumination system or after a light patterning system. In this manner, the optical element, under control of the dynamic electric field, can dynamically change its propagation characteristics to dynamically change either a beam of illumination from the illumination system or a patterned beam of radiation from the patterning system, such that they exhibit desired light characteristics.

14 Claims, 11 Drawing Sheets

(56) References Cited

U.S. PATENT DOCUMENTS

| | | | |
|---|---|---|---|
| 5,140,366 A | 8/1992 | Shiozawa et al. |
| 5,212,583 A | 5/1993 | Vali et al. |
| 5,299,054 A | 3/1994 | Geiger |
| 5,317,446 A | 5/1994 | Mir et al. |
| 5,846,678 A | 12/1998 | Nishigori et al. |
| 5,872,360 A | 2/1999 | Paniccia et al. |
| 5,991,016 A | 11/1999 | Irie |
| 6,009,110 A | 12/1999 | Wiechmann et al. |
| 6,473,542 B1 | 10/2002 | Yamada et al. |
| 6,577,379 B1 | 6/2003 | Boettiger et al. |
| 6,636,349 B2 | 10/2003 | Takahashi et al. |
| 6,708,003 B1 | 3/2004 | Wickham et al. |
| 6,709,003 B2 | 3/2004 | Laughlin et al. |
| 6,903,862 B2 | 6/2005 | Minemoto et al. |
| 6,924,870 B1 | 8/2005 | Wang et al. |
| 7,098,992 B2 | 8/2006 | Ohtsuki et al. |
| 7,142,353 B2 | 11/2006 | Tsacoyeanes et al. |
| 7,876,420 B2 | 1/2011 | Tsacoyeanes et al. |
| 2003/0133651 A1 | 7/2003 | Hakimi et al. |
| 2003/0169160 A1 | 9/2003 | Rodriguez et al. |
| 2004/0012844 A1 | 1/2004 | Ohtsuki et al. |
| 2004/0090660 A1 | 5/2004 | Minemoto et al. |
| 2004/0184163 A1 | 9/2004 | Nishioka et al. |
| 2005/0084199 A1 | 4/2005 | Hirohashi et al. |
| 2006/0023280 A1 | 2/2006 | Mossberg |
| 2006/0087720 A1 | 4/2006 | Tsacoyeanes et al. |
| 2006/0121375 A1 | 6/2006 | Tsacoyeanes et al. |
| 2006/0164711 A1 | 7/2006 | Govil et al. |

FOREIGN PATENT DOCUMENTS

| | | | |
|---|---|---|---|
| JP | 62-280818 A | 12/1987 |
| JP | 04-016821 A | 1/1992 |
| JP | 05-234850 A | 9/1993 |
| JP | 06-087693 A | 3/1994 |
| JP | 08-179514 A | 7/1996 |
| JP | 08-330223 A | 12/1996 |
| JP | 09-019994 A | 1/1997 |
| JP | 09-199394 A | 7/1997 |
| JP | 11-068209 A | 3/1999 |
| JP | 2000-098432 A | 4/2000 |
| JP | 2000-338531 A | 12/2000 |
| JP | 2000-346802 A | 12/2000 |
| JP | 2001-085306 A | 3/2001 |
| JP | 2004-170940 A | 6/2004 |

OTHER PUBLICATIONS

Faria, J.A. Brandao, "Analysis of the Electro-optic Effect in Anisotropic Crystals with 2-mm and 3-m Point Technique", Microwave and Optical Technology Letters, Texas A&M University, vol. 6, No. 14, Nov. 1993, pp. 815-820.

English-Language Translation of Notice of Reason for Refusal directed to related Japanese Application No. 2005-3540000, mailed Feb. 1, 2007, from the Japanese Patent Office; 4 pages.

English-Language Abstract for JP 62-280818 A, published Dec. 5, 1987; 1 page.

English-Langauge Abstract for JP 04-016821 A, published Jan. 21, 1992; 1 page.

English-Language Abstract for JP 05-234850 A, published Sep. 10, 1993; 1 page.

English-Language Abstract for JP 06-087693 A, published Mar. 29, 1994; 1 page.

English-Language Abstract for JP 08-179514 A, published Jul. 12, 1996; 1 page.

English-Language Abstract for JP 08-330223 A, published Dec. 13, 1996; 1 page.

English-Language Abstract for JP 09-199394 A, published July 31, 1997; 1 page.

English-Language Abstract for JP 11-068209 A, published Mar. 9, 1999; 1 page.

English-Language Abstract for JP 2000-338531 A, published December 8, 2000; 1 page.

English-Language Abstract for JP 2000-346802 A, published Dec. 15, 2000; 1 page.

English-Language Abstract for JP 2001-085306 A, published Mar. 30 2001; 1 page.

English-Language Abstract for JP 2001-085306 A, published December 15, 2000; 1 page.

Non-Final Rejection mailed Mar. 13, 2006 for U.S. Appl. No. 10/972,582, filed Oct. 26, 2004; 14 pages.

Notice of allowance mailed Jul. 21, 2006 for U.S. Appl. No. 10/972,582, filed Oct. 26, 2004; 7 pages.

Non-Final Rejection mailed Sept. 17, 2008 for U.S. Appl. No. 11/005,222, filed Dec. 7, 2004; 8 pages.

Non-Final Rejection mailed May 1, 2009 for U.S. Appl. No. 11/005,222, filed Dec. 7, 2004; 8 pages.

Final Rejection mailed Nov. 2, 2009 for U.S. Appl. No. 11/005,222, filed Dec. 7, 2004; 10 pages.

Non-Final Rejection mailed Apr. 20, 2010 for U.S. Appl. No. 11/005,222, filed Dec. 7, 2004; 9 pages.

Non-Final Rejection mailed Jul. 29, 2010 for U.S. Appl. No. 11/005,222, filed Dec. 7, 2004; 10 pages.

Notice of Allowance mailed Nov. 12, 2010 for U.S. Appl. No. 11/005,222, filed Dec. 7, 2004; 7 pages.

Non-Final Rejection mailed Feb. 26, 2009 for U.S. Appl. No. 11/039,900, filed Jan. 24, 2005; 11 pages.

Non-Final Rejection mailed Aug. 31, 2009 for U.S. Appl. No. 11/039,900, filed Jan. 24, 2005; 10 pages.

Notice of Abandonment mailed Mar. 25, 2010 for U.S. Appl. No. 11/039,900, filed Jan. 24, 2005; 2 pages.

English-Language Abstract for Japanese Patent Publication No. 09-019994 A, published Jan. 21, 1997, from the Japanese Patent Office; 1 page.

English-Language Abstract for Japanese Patent Publication No. 2000-098432 A, published Apr. 7, 2000, from the Japanese Patent Office; 1 page.

English-Language Translation of Notice of Reasons for Rejection directed to related Japanese Patent Application No. 2009-234218, mailed Aug. 25, 2011, from the Japanese Patent Office; 5 pages.

METHOD UTILIZING AN ELECTROOPTIC MODULATOR

CROSS REFERENCE TO RELATED APPLICATION(S)

This application is a Divisional Application of U.S. App. No. 11/005,222, filed Dec. 7, 2004 (that issued as U.S. Pat. No. 7,876,420 on Jan. 25, 2011), which is incorporated by reference herein in its entirety.

BACKGROUND OF THE INVENTION

1. Field of the Invention

The present invention is related to electrooptic modulators.

2. Background Art

In a pattern generating environment that patterns an impinging beam of radiation, which is later projected onto an object, controlling characteristics of the illumination beam of radiation and/or the patterned beam is critical. This is because in order to form accurate patterns on the object, the beam and/or the patterned beam have to be precisely controlled.

Generally, patterning systems use static optical systems, which are typically designed and manufactured for each application in order to produce the light beams with desired characteristics. In the static optical system example, when a change in illumination characteristics is desired or needed, a new optical system must be designed and manufactured, which is costly in terms of money and time. Also, as an output of an illumination source changes with time, this cannot normally be accounted for, which can result in less than desirable results.

In other examples, current methods result in less throughput because corrections are made by throwing away light in areas with unwanted light characteristics and/or because corrections are being performed by relatively slow mechanical devices.

Further, in some examples, by correcting for one optical characteristic, e.g., light intensity uniformity, other characteristics become undesirable, e.g., ellipticity and/or telecentricity.

Therefore, what is needed is a system and method utilizing a dynamic optical system that is adjustable, possibly automatically, in response to measured or detected characteristics of an illumination beam and/or patterned illumination beam, which system and method do not affect throughput during corrections and/or disturb other optical characteristics.

BRIEF SUMMARY OF THE INVENTION

An embodiment of the present invention provides a system comprising an illumination system, a patterning device, a projection system, a feedback system, an optical element, and a generator. The illumination system produces a beam of radiation. The patterning device patterns the beam of radiation. The projection system projects the patterned beam onto a target portion of an object at an image plane. The feedback system detects at least a part of the projected patterned beam falling on the image plane and generates a control signal therefrom. The generator generates an electrical field, based on the control signal. The electric field is applied to the optical element, such that the applied electrical field changes the index of refraction in at least one direction in the optical element to control propagation of the beam through the optical element.

Another embodiment of the present invention provides a method, comprising the following steps: patterning a beam of radiation with a pattern generating device; projecting the patterned beam onto a target portion of an object positioned in an image plane; controlling propagation of the beam or the patterned beam using a feedback system that detects at least a part of the projected patterned beam falling on the image plane and generates a control signal therefrom; positioning an optical element at a desired location proximate the pattern generating device or proximate the object; generating an electrical field, based on the control signal; and applying the electric field to the optical element, such that the applied electrical field changes the index of refraction in at least one direction in the optical element to control propagation of the beam or the patterned beam through the optical element.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a system and method utilizing an optical element controlled by an electrical field, which changes an index of refraction in at least one direction within the optical element. The change in index of refraction imparts a change to a beam of radiation passing through the optical element. The electric field is controlled by a feedback/control signal from a feedback system that includes a detector positioned proximate an image plane in the system. The optical element can be positioned in various places within the system depending on the light characteristics that need to be adjusted, for example after an illumination system or after a light patterning system. In one example, it is placed in the illumination optics. In this manner, the optical element, under control of the dynamic electric field, changes its propagation characteristics to dynamically change a beam of illumination from the illumination system and/or a patterned beam of radiation from the patterning system, such that they exhibit desired light characteristics.

In various examples, the light characteristics can be adjusted either locally (e.g., at desired locations within a field at the image plane) or globally (e.g., across the entire field at the image plane).

Example dynamically controllable light characteristics include, but are not limited to, intensity, ellipticity, telecentricity, directivity, uniformity, or the like. For example, these characteristics can be used to control pattern feature dimensions, for example, line width using intensity control, HV bias (e.g., a difference in line width between horizontally and vertically oriented resist features that, other than orientation, should be identical) using ellipticity control, and overlay (e.g., a positioning of a pattern over a previously formed pattern) using telecentricity control. As another example, these features can be used to control a pupil fill or shape.

Exemplary Electrooptic Modulators

Figure 1:
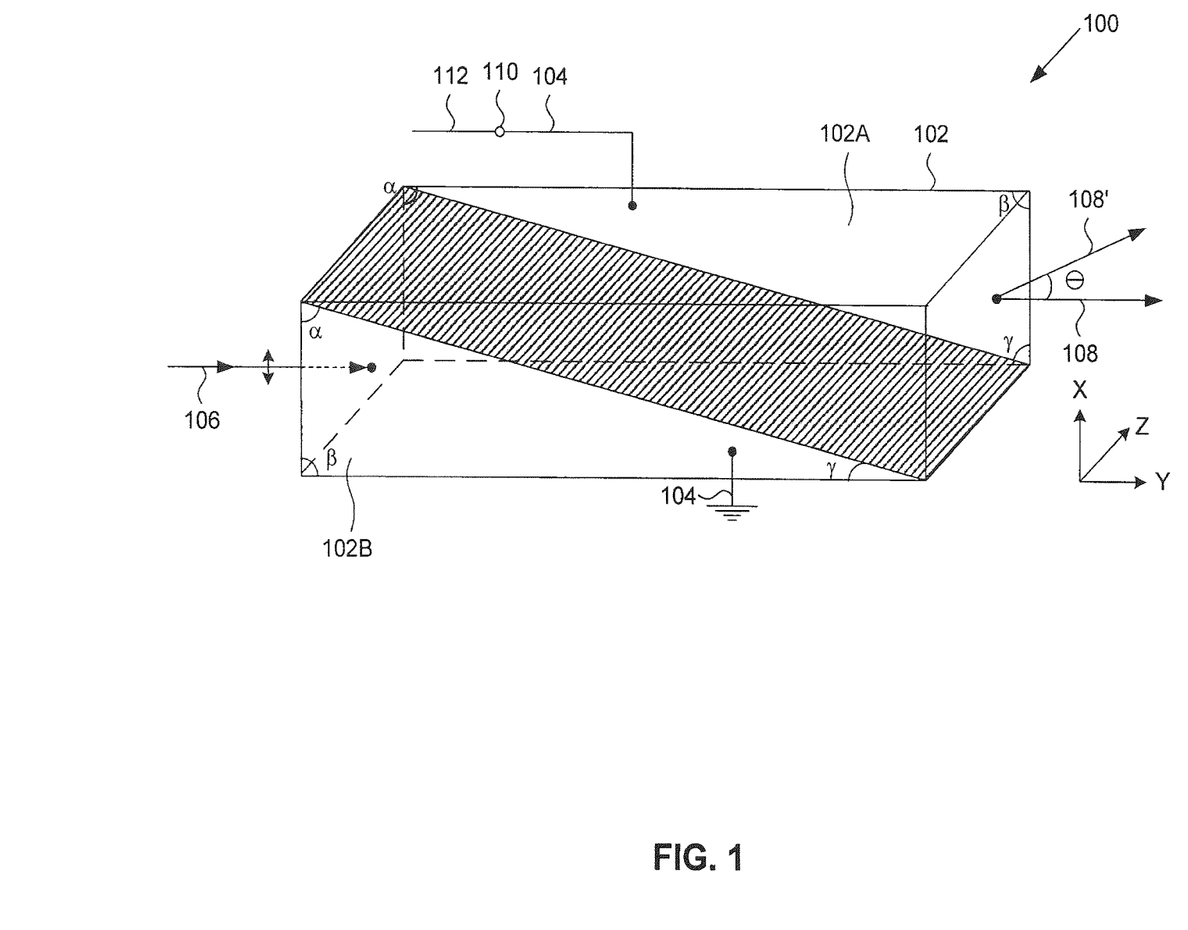
FIG. 1 shows an electrooptic modulator, according to one embodiment of the present invention.

FIG. 1 shows system 100, according to one embodiment of the present invention. For example, system 100 can be an electrooptic modulator. System 100 comprises an optical element 102 including a first portion 102A and a second portion 102B (e.g., first and second prisms, first and second wedges, or the like) that receive an electric field from an generator 104. In one example, first and second portions 102A and 102B of optical element 102 are coupled together with their crystal axes reversed. An orientation of optical element 102 in the X, Y, and Z directions is shown adjacent optical element 102. Application of electrical field E' to optical element 102 using generator 104 forms an electrooptic modulator. In the perspective shown, generator 104 is coupled to first and second sides, both being parallel to a plane of the page. For example, this can be done to steer beam 106 to produce an output beam 108 that propagates in a direction at an angle θ with respect to beam 106. In this embodiment, optical element 102 is made from a material having one or more properties that are controllable by an electric field, as discussed in more detail below.

It is to be appreciated that beam 106 may contain several sub-beams that can be deflected together, e.g., to form a single output beam 108, or separately, to form multiple output beams 108. In another example, multiple beams 106 can be received by optical element 102, and optical element 102 can be used to form one or more output beams 108 from the multiple input beams 106.

In one example, each portion 102A and 102B has similar dimensions, i.e., angles α, β, and γ are similar for each portion 102A and 102B. For example, α and γ can be 45° and β can be 90° (e.g., a 45-45-90 triangle), or in another example α and γ can be 30° and 60°, respectively, and β can be 90° (e.g., a 30-60-90 triangle). The dimensions of portions 102A and 102B are application specific, depending on desired propagation characteristics.

In one example, surfaces of portions 102A and 102B can have any desired finish to allow for smearing of non-uniformities in beam 106 as it propagates through optical element 102.

In one example, a node 110 of generator 104 receives a control signal 112, for example, from a feedback system (not shown) positioned proximate an image plane (not shown). A feedback system arrangement is shown, for example, in FIGS. 8, 9, and 10, discussed below.

In the example of FIG. 1, optical element 102 (e.g., an electrooptic crystal) is used to deflect beam 106. In one example, two portions 102A and 102B of optical element 102 are coupled together with their crystal axes reversed. By applying a voltage using generator 104 to first and second portions 102A and 102B, an index of refraction of each of first and second portions 102A and 102B is varied with respect to each other, which results in a deflected output beam 108. An angle of deflection (θ) through portions 102A and 102B depends on: (1) the magnitude of electrooptic tensor components that are used (e.g., depending on the crystal orientation), (2) a value of control signal 110 (e.g., a value of a voltage signal) applied by generator 104, and (3) dimensions of optical element 102.

Figure 11:
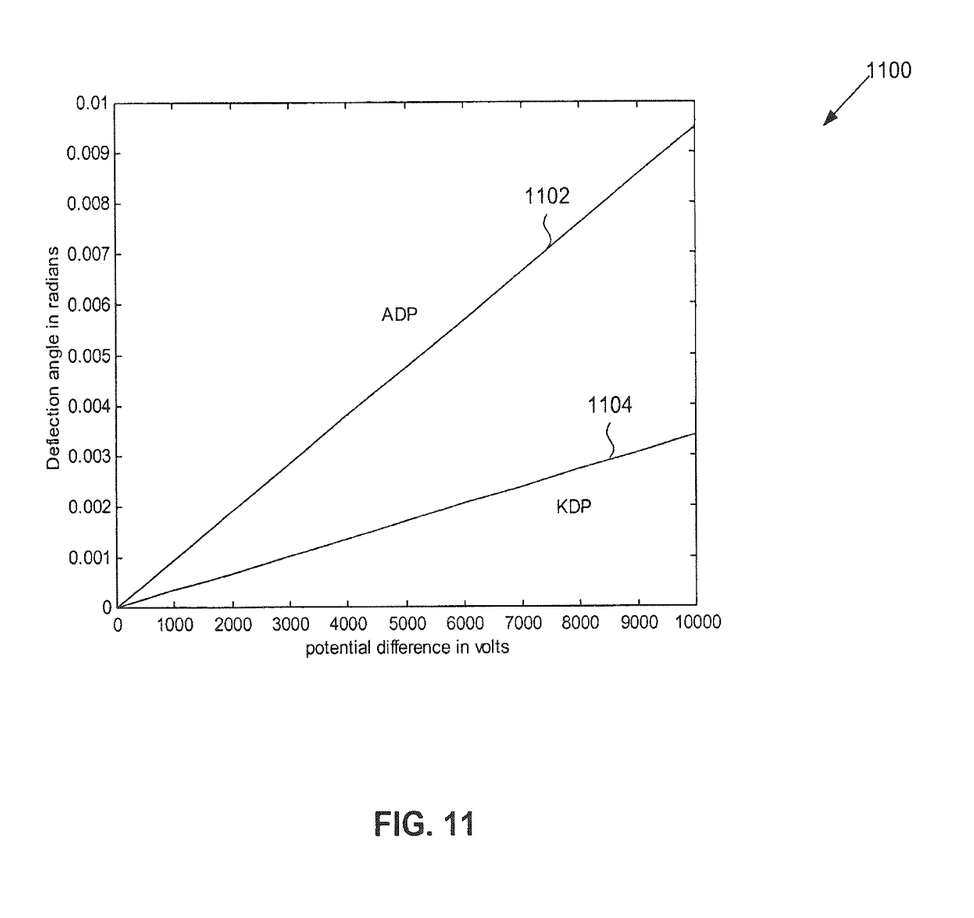
FIG. 11 shows a graph of light beam deflection using an electrooptic modulator, according to one embodiment of the present invention.

FIG. 11 shows a graph 1100 of light beam deflection versus potential difference in voltage using, for example, electrooptic modulator 100, according to one embodiment of the present invention.

In one example, beam 106 will deflect to produce output beam 108 according to the equation:

$$\theta = \frac{l\eta_0^3 rE}{D}$$

In this equation, l is depth of crystal, E is electric field, r is electro-optic coefficient, $\eta_0$ is index of refraction, and D is a height of the crystal. Line 1102 in graph 1100 is for an electrooptic modulator made from ADP, described below, and line 1104 in graph 1100 is for an electrooptic modulator made from KDP, described below.

It is to be appreciated that other arrangements of optical elements and generators can also be used to form an electrooptic modulator, for example as is described in U.S. Pat. No. 7,142,353, which is incorporated by reference herein in its entirety.

In one example, optical element 102 is a crystal material. For example, one crystal material that can be used is Lithium Triborate ($LiB_3O_5$) (LBO) manufactured by EKSMA Co. of Vilnius, Lithuania. In other examples, potassium dihydrogen phosphate ($KH_2PO_4$) (also known as KDP), or ammonium dihydrogen phosphate ($NH_4H_2PO_4$) (also known as ADP) can be used, which exhibit similar electrooptic characteristics to LBO, but have lower transmission efficiency than LBO. However, other known materials can also be used without departing from the scope of the present invention. It is to be appreciated that although typically both portions 102A and 102B are made from the same material, in some embodiments different materials can be used for each portion.

In the above embodiment, electrooptic modulator 100 makes use of the linear electrooptic effect, which results from a change in the indices of refraction in different directions in an optical element (e.g., a crystal) due to an applied electric field. The effect exists only in crystals that do not possess inversion symmetry. This can be expressed in an index of ellipsoid equation, which expresses the change in anisotropy of a crystal with the electric field. The equation below describes the general form for the equation of the index of ellipsoid for an arbitrarily chosen orthogonal coordinate system in a crystal as:

$$\left(\frac{1}{n^2}\right)_1 x^2 + \left(\frac{1}{n^2}\right)_2 y^2 + \left(\frac{1}{n^2}\right)_3 z^2 + 2\left(\frac{1}{n^2}\right)_4 yz + 2\left(\frac{1}{n^2}\right)_5 xz + 2\left(\frac{1}{n^2}\right)_6 xy = 1$$

Where n is the constant for the index of refraction for a material being used. The change in index of refraction (n) due to an applied electric field (E) can be expressed in the matrix form as:

$$\begin{bmatrix} \Delta\left(\frac{1}{n^2}\right)_1 \\ \Delta\left(\frac{1}{n^2}\right)_2 \\ \Delta\left(\frac{1}{n^2}\right)_3 \\ \Delta\left(\frac{1}{n^2}\right)_4 \\ \Delta\left(\frac{1}{n^2}\right)_5 \\ \Delta\left(\frac{1}{n^2}\right)_6 \end{bmatrix} = \begin{bmatrix} r_{11} & r_{12} & r_{13} \\ r_{21} & r_{22} & r_{23} \\ r_{31} & r_{32} & r_{33} \\ r_{41} & r_{42} & r_{43} \\ r_{51} & r_{52} & r_{53} \\ r_{61} & r_{62} & r_{63} \end{bmatrix} \begin{bmatrix} E_1 \\ E_2 \\ E_3 \end{bmatrix}$$

The second matrix in this expression is an electrooptic tensor, discussed above with respect to FIG. 1. If nonzero elements are present in this tensor, then the material exhibits the electrooptic effect.

Usually a coordinate system is determined so that equation 1 in the presence of an applied electric field reduces as follows:

$$\left(\frac{1}{n^2}\right)_{1'} x'^2 + \left(\frac{1}{n^2}\right)_{2'} y'^2 + \left(\frac{1}{n^2}\right)_{3'} z'^2 = 1$$

Depending on the exact nature of the electrooptic tensor, a direction for the applied electric field can be determined that induces a change in the indices of refraction in perpendicular directions. Thus, the properties of the electrooptic modulator 100 are dynamically controllable because the voltage dependent index of refraction induces a retardation between the incident electric field components in the perpendicular directions. The directions chosen depend upon the symmetry properties of the crystal of interest. The retardation is proportional to the applied voltage and the corresponding electrooptic tensor component. The net effect of this is to create a voltage varying phase difference between the two directions, which can be used for different applications.

In another example, contacting surfaces between prisms 102A and 102B has a desired profile, which allows optimizing of an applied voltage. For example, smaller voltages can be used when a fixed profile exists and can be modulated using external voltages.

In another example, because one electrooptic modulator 100 is used to control an angular distribution of light, first and second electrooptic modulators 100 placed one after the other and one being rotated with respect to the other around the y axis, for example 90°, can control laser beam divergence in two directions, either to eliminate beam divergence or make beam divergence the same in orthogonal directions, which can insure that pupil fill ellipticity is within a desired tolerance and/or which can be used for any application that desires changing the beam direction.

In another example, electrooptic modulator 100 allows for varying ellipticity in order to correct for HV bias both globally (e.g., across an entire filed in the image plane) or locally (e.g., in one or more positions within the field in the image plane).

In one example, an electrooptic system for electrooptic modulator 100 allows for very fast response times to be achieved for the correction of uniformity variations, as compared to mechanical device in conventional systems. The fast response times allow for real-time corrections during scanning to significantly improve dose uniformity.

In one example, one or more sides can have antireflection or high reflecting coatings, or the like, thereon to control whether beam 106 reflects or does not reflect from that particular side. This can ensure no stray light leaves electrooptic modulator 100 through that particular side and/or to properly direct light through electrooptic modulator 100.

Exemplary Arrays of Electrooptic Modulators

Figure 2:
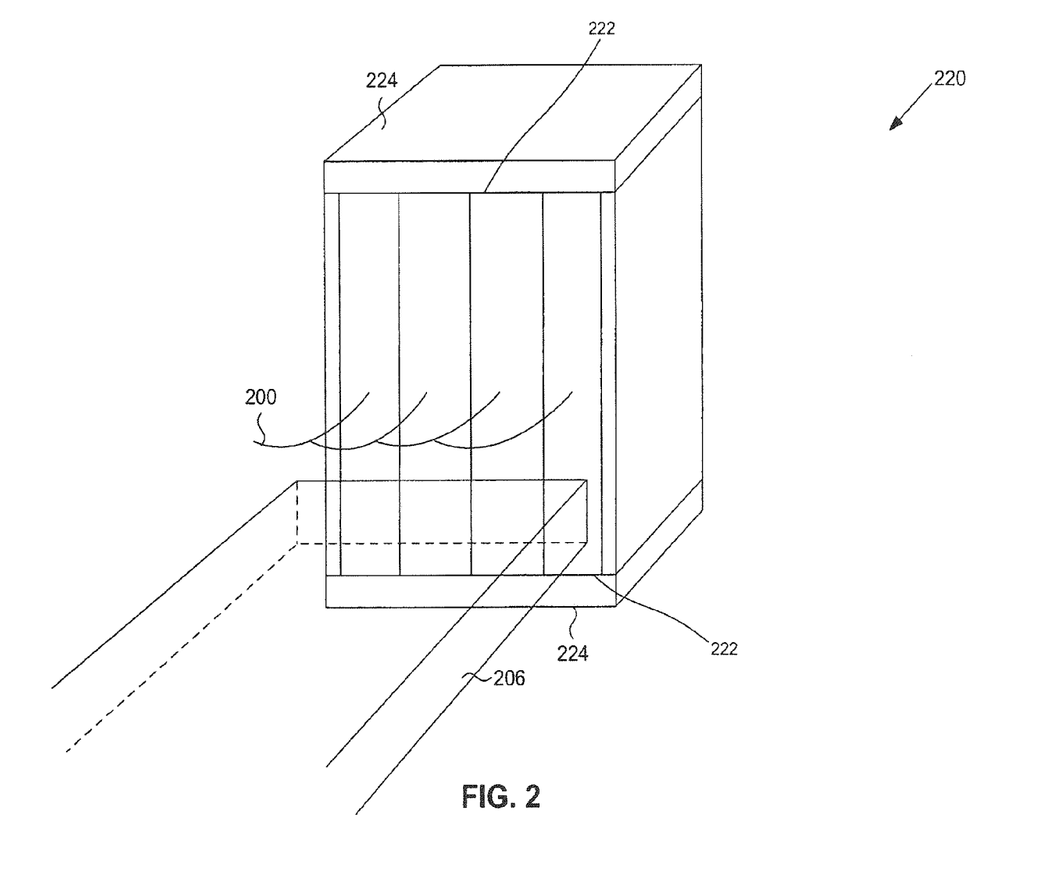
FIGS. 2, 3, and 4 show arrays of electrooptic modulators, according to various embodiments of the present invention.
Figure 3:
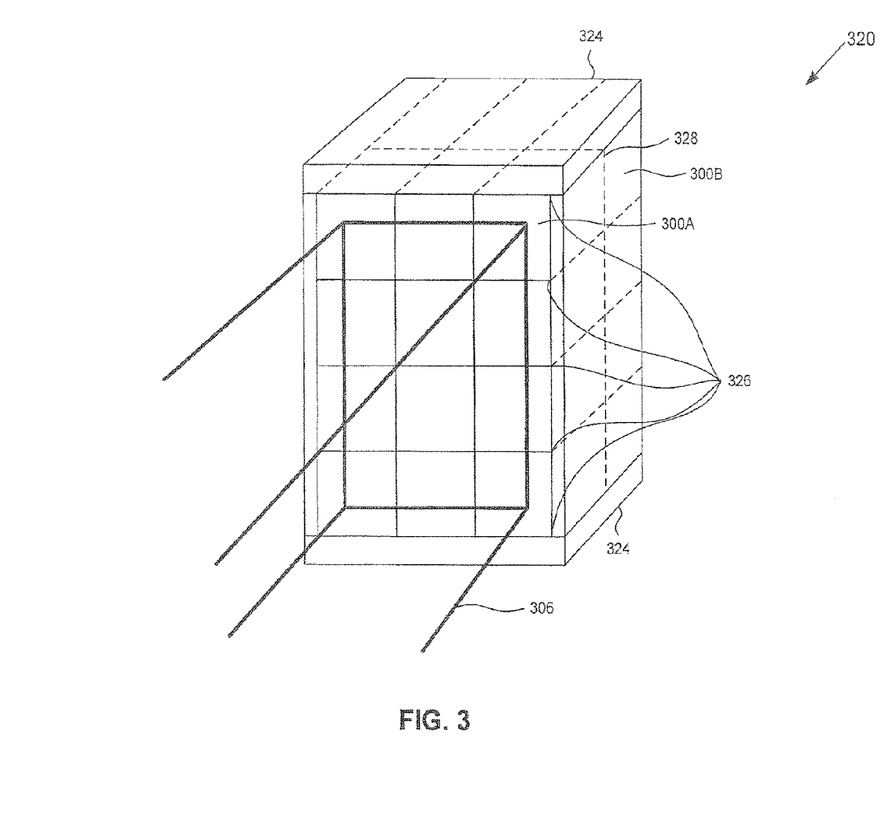
Figure 4:
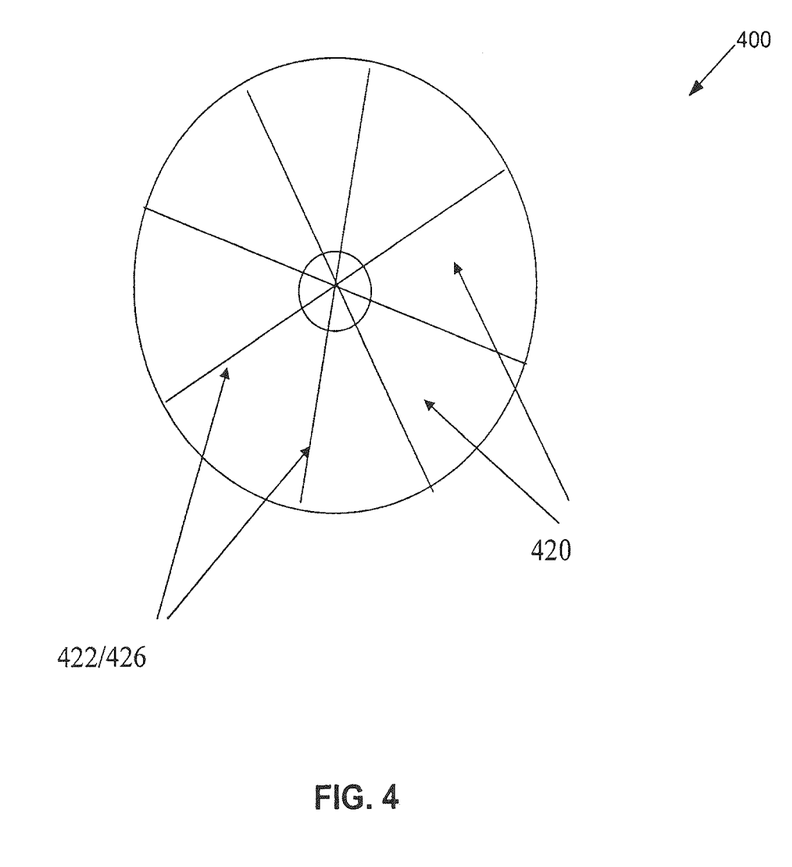

FIGS. 2, 3, and 4 show arrays 220, 320, and 420 of electrooptic modulators 200, 300, and 400, according to various embodiments of the present invention. Although electrooptic modulators 200, 300, and 400 each include first and second portions (not shown), similar to portions 102A and 102B, for convenience the diagonal plane between the first and second portions are not shown in FIGS. 2, 3, and 4.

It is to be appreciated that the number, sizes, and/or shapes of beams shown in FIGS. 2, 3, and 4 are merely exemplary, and can be different shapes and sizes, or can be multiple beams, according to various embodiments based on a specific application utilizing the arrays of electrooptic modulators.

FIG. 2 shows a 1×n (n being a positive integer greater than 1) array 220 of electrooptic modulators 200, according to one embodiment of the present invention. Each modulator 200 has electrodes 222 coupled to two, opposite sides and supports 224 coupled to two, opposite ends of modulators 200. In this perspective, electrodes 222 are vertical electrodes. This arrangement allows for single-direction modulation of a beam 206 propagating through array 220. In this example, beam 206 has a rectangular cross-section. Thus, beam 206 can be modulated in one of a X or Y direction, depending on an orientation of array 220 and electrodes 222 with respect to the cross-section of beam 206. It is to be appreciated that, although four electrooptic modulators 200 are shown, any number can be used, as is contemplated within the scope of the present invention.

FIG. 3 shows a stacked n×m (n and m being positive integers greater than or equal to 1) array 320 of electrooptic modulators 300, according to one embodiment of the present invention. In this embodiment, a first stack, stack A, includes electrooptic modulators 300A and a second stack, stack B, includes electrooptic modulators 300B. The first and second stacks are shown as being adjacent dashed line 328. It is to be appreciated that additional stacks could also be used. With reference to elect optic modulator 100 in FIG. 1, stack A is oriented similar to electrooptic modulator 100, while electrooptic modulators 300B in stack B are rotated around the y axis 90° with respect to electrooptic modulators 300A, or vice versa This allows for two-directional control, as discussed above and below.

Electrodes 326 are coupled to two opposite sides of each modulator 300. Also, array 320 includes supports 324 coupled to two, opposite ends of modulators 300. This arrangement allows for two-direction modulation of a beam 306 propagating through array 320. In this example, beam 306 has a rectangular cross-section, which can be modulated in the X and Y directions because of the orientation of array 320 and electrodes 326 with respect to the cross-section of beam 306. It is to be appreciated that, although 24 electrooptic modulators 300 are shown, any number can be used, as is contemplated within the scope of the present invention.

FIG. 4 shows a concentric array 420 of electrooptic modulators 400, according to one embodiment of the present invention. Similar to modulators 200 and 300 in arrays 220 and 320 discussed above, modulators 400 have electrodes 422/426 coupled to their sides in order to allow for the functionality discussed above. Although shown as single circular array 420, one or more concentric circular arrays 420 can be used, as would become apparent to one of ordinary skill in the art.

In one example, various sub-beams of an incident beam impinging on one of the above-described arrays can be deflected in adjustable, individually controllable directions. In one example, by deflecting sub-beams from areas that have higher intensities to areas with lower intensities, uniformity irregularities can be smoothed out. Therefore, there is substantially little or no light loss.

In another example, multiple incident beams can be deflected independently before being combined into a single beam either at an output end of the modulator or after leaving the modulator.

In one example, this arrangement allows for correction of high spatial frequency components in the uniformity variations.

In one example, the arrays operate at relative high speeds, which allows spatial uniformity correction while scanning a field of an image plane.

In one example, a single element, such as shown in FIG. 1, or an array of elements, as shown in FIGS. 2-4, can be used for laser beam steering in a microlithography tool to correct for pointing errors.

Exemplary Electrode Arrangements

Figure 5:
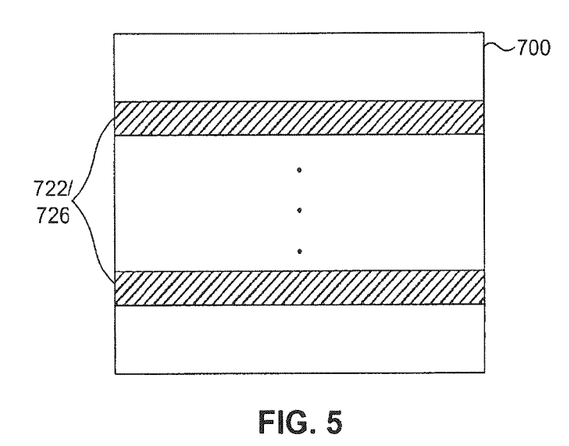
FIGS. 5, 6, and 7 show various arrangements of electrodes on an electrooptic modulator, according to various embodiments of the present invention.
Figure 6:
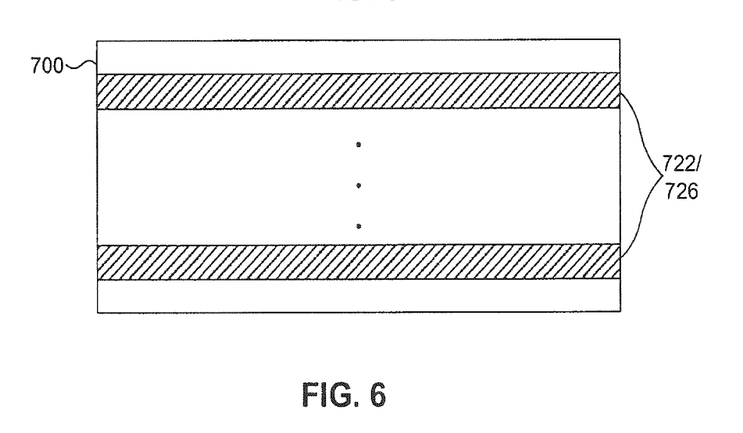
Figure 7:
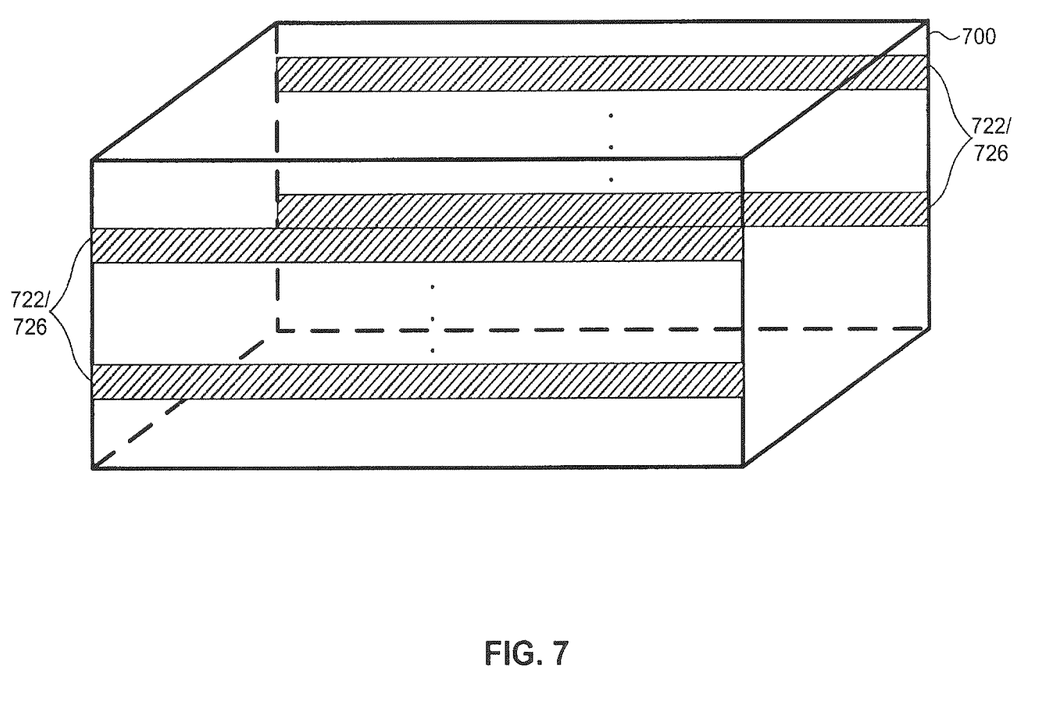

FIGS. 5, 6, and 7 show end, side, and perspective views, respectively, of various arrangements of electrodes 722/726 on an electrooptic modulator 700, according to various embodiments of the present invention. In the above described embodiments, an electrode was coupled to either two opposite sides or two sets of opposite sides of one or more electrooptic modulators. However, as shown in FIGS. 5, 6, and 7, more than one electrode 722/726 can be coupled to each side of electrooptic modulator 700. This can be done to increase controllability of one or more beams of radiation (not shown) propagating through modulator 700. Also, although shown horizontally in this perspective, vertically coupled electrodes can also be used.

In one example, through the use of a two prism optical element 700 with multiple electrodes 722/726, portions of a beam impinging thereon can be steered in different directions. This can provide extremely high resolution in angular distribution.

Thus, through the use of electrodes 722/726 coupled in different arrangements to sides of optical element 102, or arrays of optical element 102, light propagating through optical element 102, or arrays thereof, can be very accurately controlled or modified as necessary or as desired. Thus, characteristics of the light, for example, uniformity, ellipticity, telecentricity, or the like, can be modified as needed or as desired. As discussed above and below, this can be used to control pupil fill or shape, for example, in an illumination or projection system.

It is to be appreciated that, although the above embodiments and example are discussed such that a beam is transmitted through an electrooptic modulator into an entry side and out an exit side, in other embodiments a surface opposite the entry surface can have a reflective coating, layer, substance, or material. Thus, instead of a beam being transmitted through the electrooptic modulator, it reflects from the side opposite the entry side and back out the entry side after changing its characteristics using an electric field. In other example, the reflection side may not be opposite the entry side, or the light may enter, reflect, and exit from three different sides.

Exemplary Environment: Lithography

Figure 8:
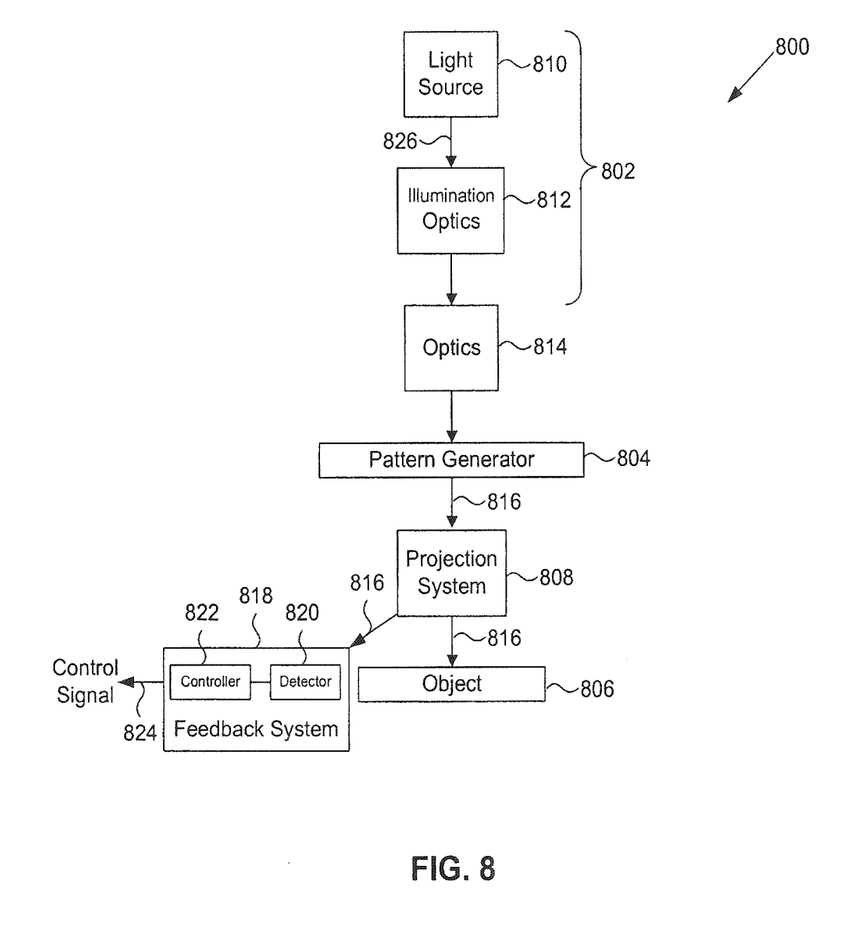
FIGS. 8, 9, and 10 show various lithography systems having an electrooptic modulator therein, according to various embodiments of the present invention.
Figure 9:
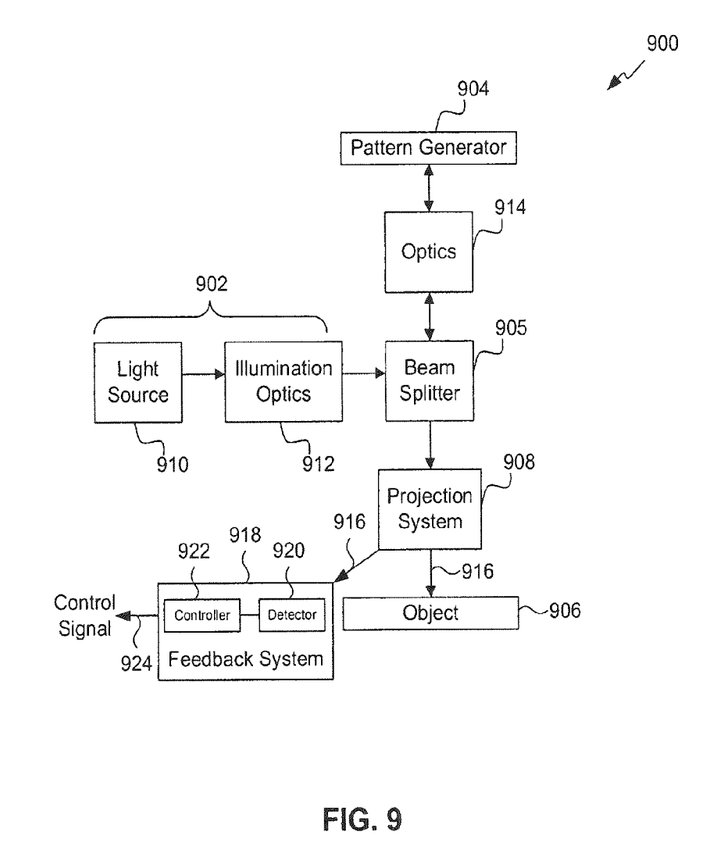
Figure 10:
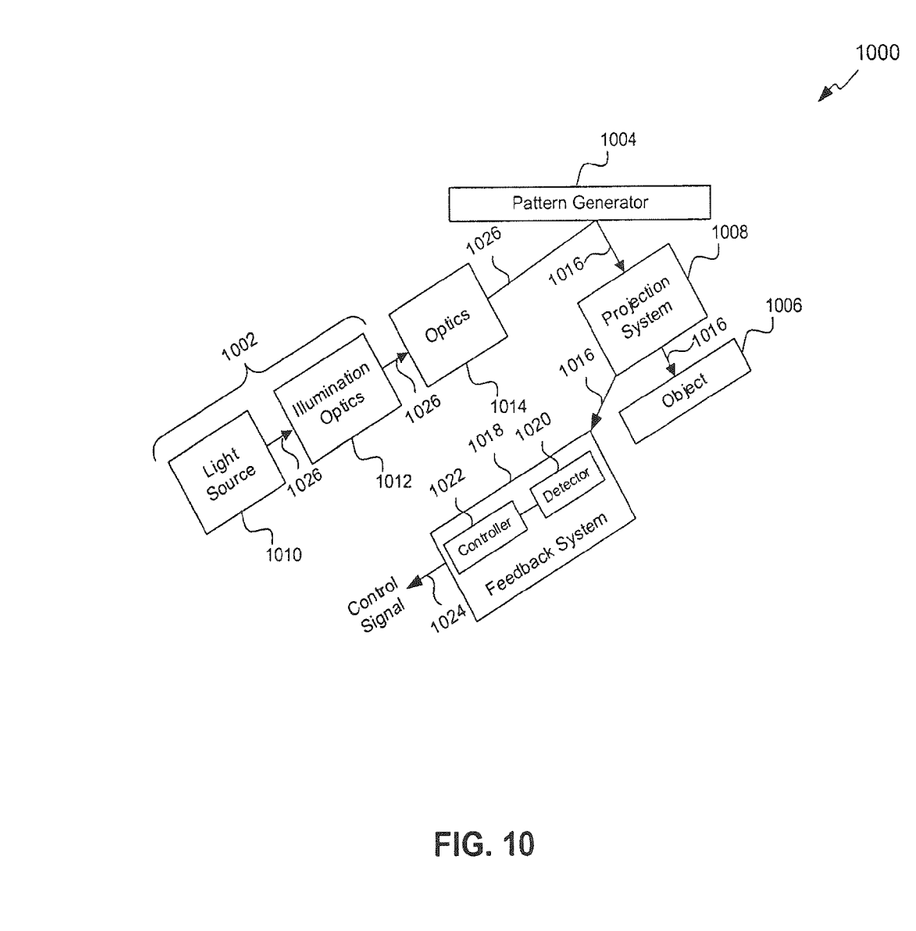

FIGS. 8, 9, and 10 show various lithography systems 800, 900, 1000, having an electrooptic modulator therein, according to various embodiments of the present invention. In these systems, radiation from an from an illumination system 802/902/1002 illuminates a pattern generator 804/904/1004 to produce patterned light, which is directed from pattern generator 804/904/1004 towards a work piece 806/906/1006 via a projection system 808/908/1008.

In system 900, light is directed to and from pattern generator 904 via a beam splitter 905.

In one example, patterned light 816/916/1016 can be received at feedback system 818/918/1018 by a detector 820/920/1020. A signal 824/924/1024 representative of received patterned light 816/916/1016 is transmitted from detector 820/920/1020 to controller 822/922/1022, and used to produce control signal 824/924/1024. Control signal 824/924/1024 can be a compensation or adjustment signal based on an actual (measured) versus desired value for an optical characteristics, for example, intensity, uniformity, ellipticity, telecentricity, etc., as discussed above. For example, in the embodiment shown in FIG. 1, control signal 824 is control signal 112 received at node 110 of generator 104, which is used to dynamically control generation of electric field to dynamically control propagation of light beam 106 through optical element 102.

In various embodiments, work piece 806/906/1006 is, but is not limited to, a substrate, a wafer, a flat panel display substrate, print head, micro or nano-fluidic devices, or the like.

Illumination system 802/902/1002 can include a light source 810/910/1010 and illumination optics 812/912/1012. Pattern generator 804/904/1004 can have optics 814/914/1014. One or both of these optics can include one or more optical elements (e.g., lenses, mirrors, etc.). For example, one or both of the optics 812/912/1012 or optics 814/914/1014 can include any one of the electrooptic modulators or arrays of modulators as described above, which can be used to dynamically control illumination light 826/926/1026 before it reaches pattern generator 804/904/1004. This can be used to control to control one of conventional, annular, single pole, multiple pole, or quasar illumination mode.

In one example, projection system 808/908/1008 includes one or more optical elements (e.g., lenses, mirrors, etc.). For example, projection system 808/908/1008 can include any of the electrooptic modulators or arrays of modulators as described above, which can be used to dynamically control patterned light 816/916/1016 before it reaches work piece 806/606/1006.

In various examples, pattern generator 804/904/1004 can be a mask-based or maskless pattern generator, as would become apparent to one of ordinary skill in the art. The masked-based or maskless system can be associated with a lithography, photolithography, microlithography, or immersion lithography system.

For example, using an array of electrooptic modulators, such as one of those described above, in one of the lithography systems 800, 900, or 1000, active control of uniformity variations is performed through redirecting a light distribution, which reduces an amount of light loss through varying of a voltage across each electrooptic modulator in the array.

In one example, the electrooptic modulator used in system 800, 900, or 1000 can be used to control an angular distribution of light at either pattern generator 804/904/1004 or a plane in which work piece 806/906/1006 is placed, effectively eliminating the need for different diffractive arrays for generating pupil fills.

In one example, the electrooptic modulator used in system 800, 900, or 1000 can be used to control pupil fill or shape in projection system 808/908/1008.

Exemplary Operation

Figure 12:
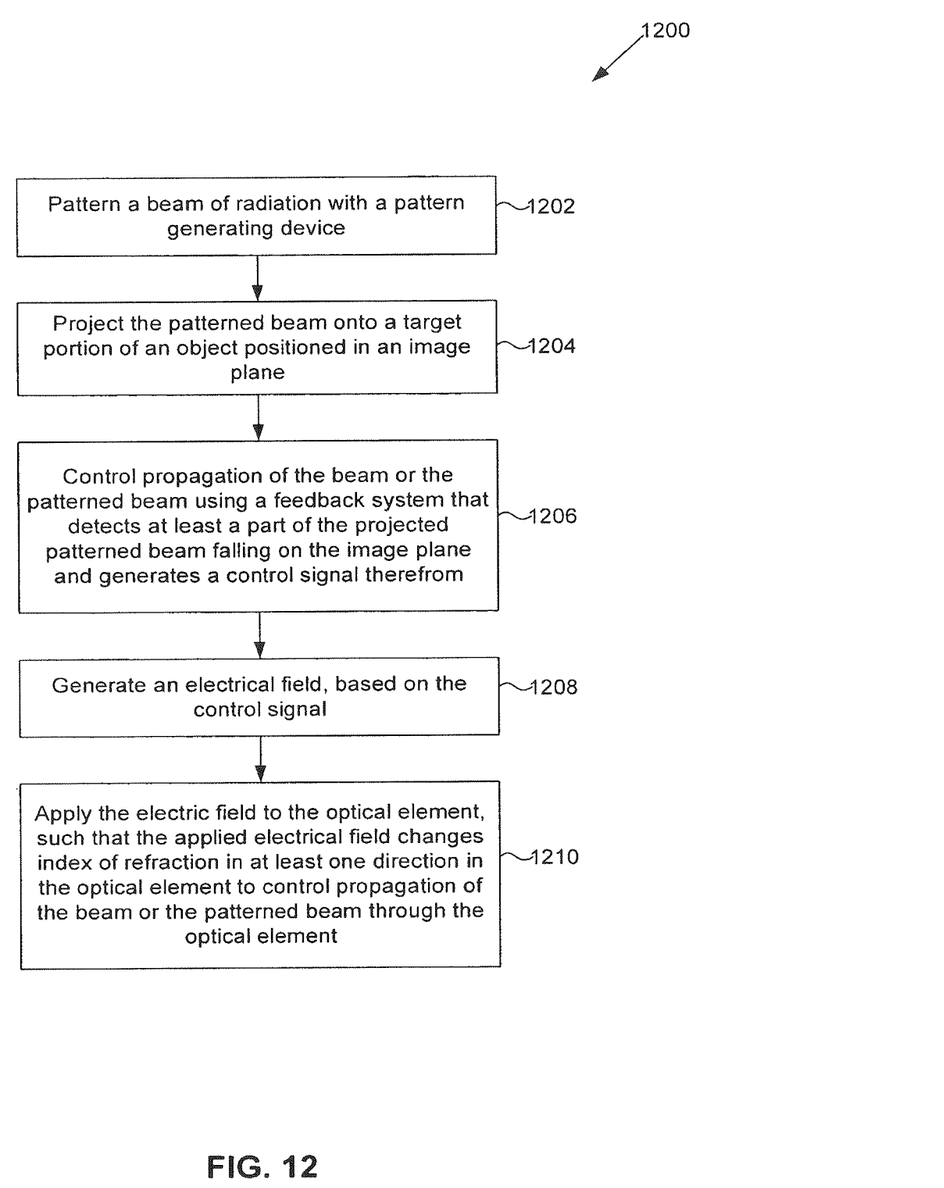
FIG. 12 shows a flowchart depicting a method, according to one embodiment of the present invention.

FIG. 12 shows a flowchart depicting a method 1200, according to one embodiment of the present invention. Method 1200 can be performed by the above described system or systems. In step 1202, a beam of radiation is pattered with a pattern generating device. In step 1204, the patterned beam is projected onto a target portion of an object positioned in an image plane. In step 1206, propagation of the beam or the patterned beam is controlled using a feedback system that detects at least a part of the projected patterned beam falling on the image plane and generates a control signal therefrom. In step 1208, an electrical field is generated, based on the control signal. In step 1210, the electric field is applied to the optical element that is positioned proximate the pattern generator or proximate the object, such that the applied electrical field changes index of refraction in at least one direction in the optical element to control propagation of the beam or the patterned beam through the optical element.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A method comprising:
   projecting a patterned beam of radiation onto a target portion of an object positioned in an image plane;
   detecting a feature of the patterned beam of radiation at the image plane;
   generating a feedback control signal based on the detected feature;
   generating an electrical field based on the feedback control signal;
   applying the electric field across at least two portions of a plurality of portions of a dynamically controllable optical element, wherein:
   the at least two portions of the plurality of portions of the dynamically controllable optical element are adjacent and rotated with respect to each other; and
   the applied electrical field changes an index of refraction in at least one direction in each of the at least two portions of the plurality of portions of the dynamically controllable optical element.

2. The method of claim 1, wherein the change in the index of refraction causes intensity modulation of at least part of the patterned beam propagating through the dynamically controllable optical element.

3. The method of claim 2, wherein the intensity modulation comprises producing a desired intensity distribution across the image plane.

4. The method of claim 1, wherein the change in the index of refraction causes ellipticity modulation of at least part of the patterned beam propagating through the dynamically controllable optical element.

5. The method of claim 4, wherein the ellipticity modulation comprises producing a constant ellipticity across the image plane.

6. The method of claim 4, wherein the ellipticity modulation comprises producing a variation in ellipticity at different locations within the image plane.

7. The method of claim 1, wherein the change in the index of refraction causes telecentricity modulation of the patterned beam propagating through the dynamically controllable optical element.

8. The method of claim 7, wherein the telecentricity modulation comprises producing a constant telecentricity across the image plane.

9. The method of claim 7, wherein the telecentricity modulation comprises producing a variation in telecentricity at different locations within the image plane.

10. The method of claim 1, further comprising;
    producing a plurality of output beams of radiation with the dynamically controllable optical element from a single input beam of radiation.

11. The method of claim 1, further comprising:
    producing a single output beam of radiation with the dynamically controllable optical element from a plurality of input beams of radiation.

12. The method of claim 1, further comprising:
    controlling an output angle of the patterned beam of radiation propagating through the dynamically controllable optical element to control a pupil shape.

13. The method of claim 1, further comprising:
    controlling an output angle of a beam of radiation produced by an illumination system propagating through the dynamically controllable optical element to control one of conventional, annular, single pole, multiple pole, or quasar illumination mode.

14. The method of claim 1, further comprising:
    controlling characteristics of the patterned beam in at least two directions using the at least two portions of the plurality of portions.

* * * * *